US 6,531,905 B1

(12) United States Patent
Wang

(10) Patent No.: US 6,531,905 B1
(45) Date of Patent: Mar. 11, 2003

(54) FLIP-FLOP WITH METASTABILITY REDUCTION

(75) Inventor: David Y. Wang, San Jose, CA (US)

(73) Assignee: Neoaxiom Corporation, San Jose, CA (US)

( * ) Notice: Subject to any disclaimer, the term of this patent is extended or adjusted under 35 U.S.C. 154(b) by 0 days.

(21) Appl. No.: 10/024,816

(22) Filed: Dec. 19, 2001

(51) Int. Cl.[7] .............................................. H03K 3/037
(52) U.S. Cl. ....................................................... 327/218
(58) Field of Search ................................. 327/199, 200, 327/211, 212, 215, 218, 219

(56) References Cited

U.S. PATENT DOCUMENTS

| | | | | |
|---|---|---|---|---|
| 4,929,850 A | 5/1990 | Breuninger | ............... | 307/272.1 |
| 4,999,528 A | 3/1991 | Keech | ........................ | 307/279 |
| 5,036,221 A | 7/1991 | Brucculeri et al. | ......... | 307/443 |
| 5,081,377 A | 1/1992 | Freyman | ..................... | 307/480 |
| 5,250,858 A | * 10/1993 | Strong | .......................... | 326/46 |
| 5,489,865 A | 2/1996 | Colvin, Sr. | .................. | 327/198 |
| 5,789,945 A | 8/1998 | Cline | .......................... | 326/94 |
| 5,825,224 A | * 10/1998 | Klass et al. | ................. | 327/200 |
| 5,999,029 A | 12/1999 | Nguyen et al. | ............. | 327/198 |
| 6,265,923 B1 | * 7/2001 | Amir et al. | .................. | 327/211 |
| 6,320,442 B1 | * 11/2001 | Sindalovsky | ................ | 327/212 |
| 6,339,345 B1 | * 1/2002 | Eto et al. | ....................... | 326/83 |

* cited by examiner

Primary Examiner—My-Trang Nu Ton
(74) Attorney, Agent, or Firm—Thomas Schneck

(57) ABSTRACT

A flip-flop circuit with metastability reduction having two internal flip-flops connected in a parallel configuration relative to an input line with a input data delay connected to the data input of one of the flip-flops. The outputs are combined and since at least one of the flip-flop outputs should be stable, if the output of one of the flip-flop goes into a metastable state, the output of the other flip-flop will stabilize it, thus producing a stable output.

8 Claims, 2 Drawing Sheets

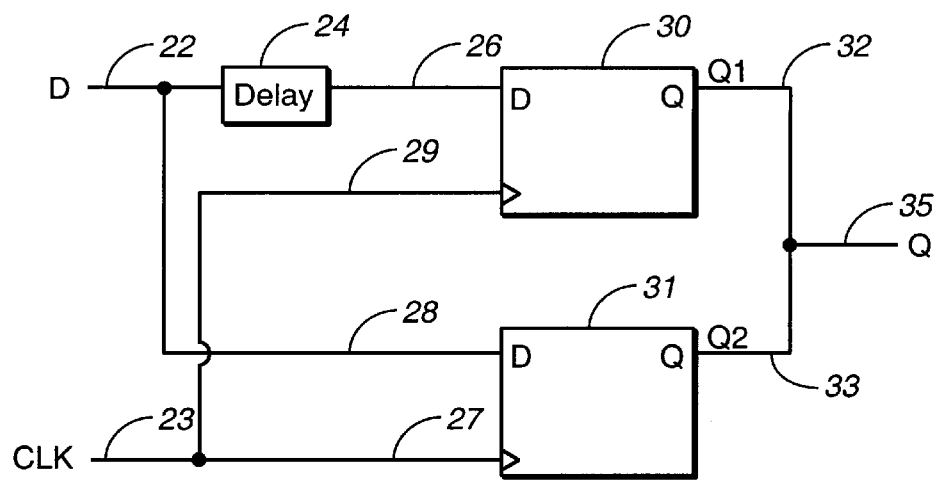
FIG._1
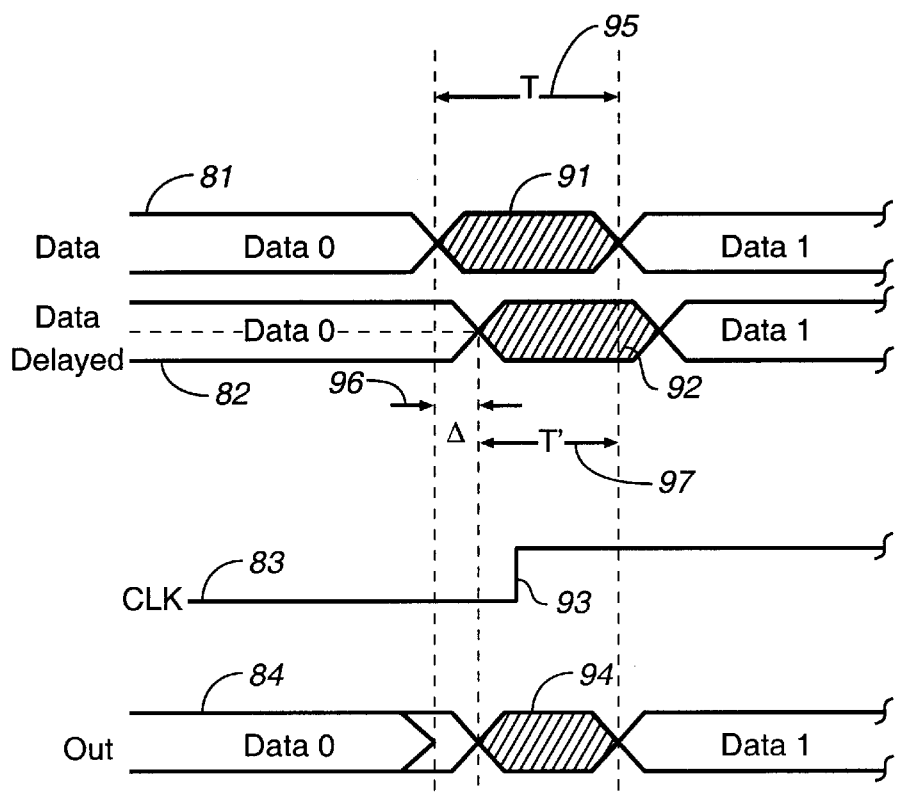
FIG._4

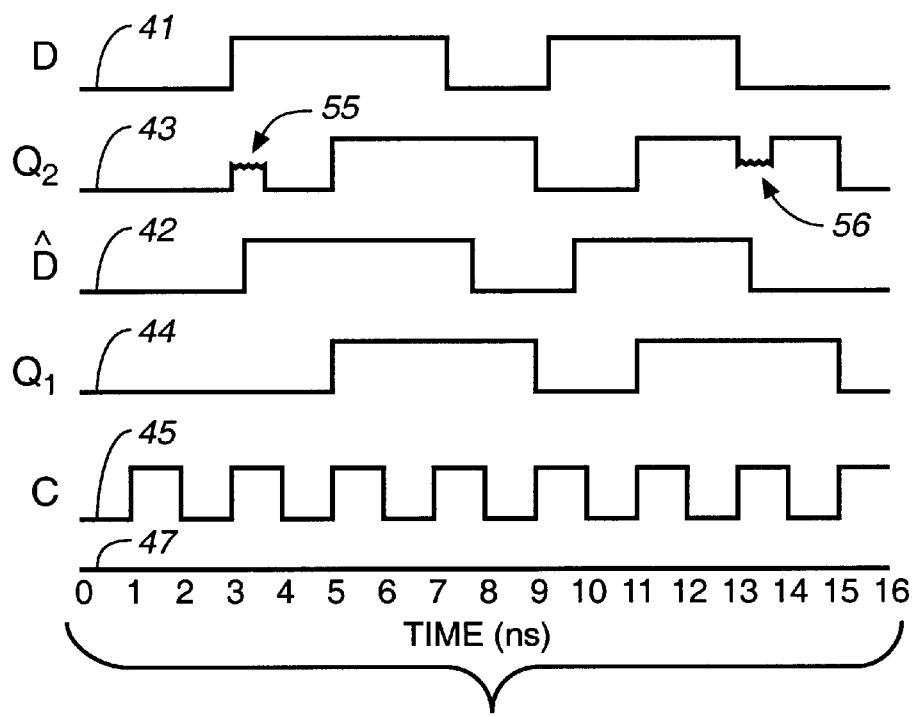
FIG._2
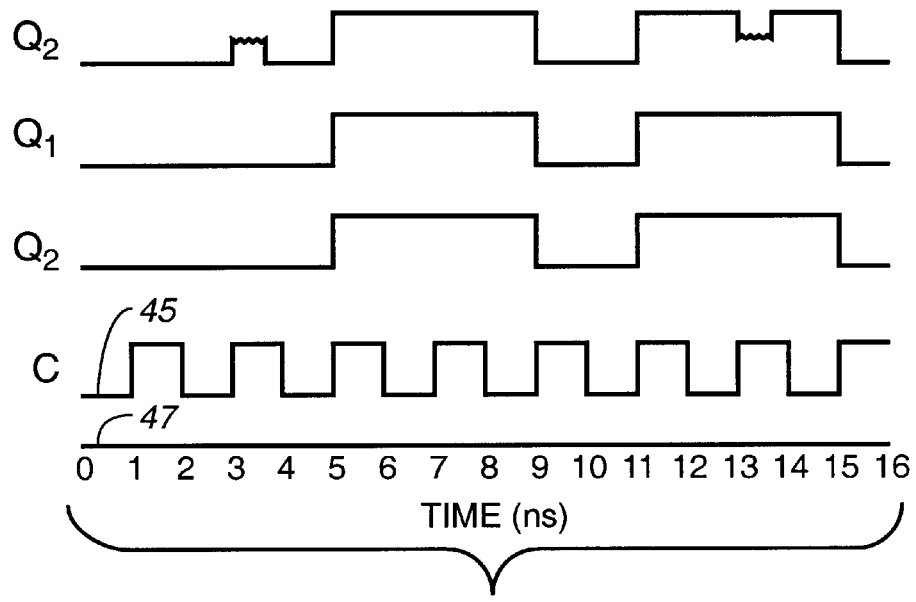
FIG._3

FLIP-FLOP WITH METASTABILITY REDUCTION

TECHNICAL FIELD

The present invention relates generally to flip-flop circuits and more specifically to a circuit for preventing a metastable output state when the data input is asynchronous.

BACKGROUND ART

Latching circuits, such as flip-flops, are often used to synchronize signals that are operating at a different frequency than the system clock signal. Synchronous circuits usually require the system clock to define precisely when events can occur. Events can occur once per clock cycle at a specified point in the clock period known as the triggering edge. These circuits perform reliably if the input signals are stable for specified times before and after every triggering edge. These specified times are called the set up and hold times. When the set up and hold conditions are violated, the output response of the flip-flop is uncertain. The output may assume a metastable state in which the output of the digital logic circuit is not at a logic level 1 or a logic level 0, but instead is at an output level between logic level 0 and logic level 1. In asynchronous circuits, this problem occurs quite often. The output goes into a metastable state when the signal being input to the flip-flop undergoes a transition from one logic level to the other simultaneously with the triggering edge of the clock pulse. Once in a metastable state, the output can oscillate for an indefinite time, or suddenly switch after an indefinite time. The output becomes unpredictable and can generate random failures in a digital system.

There have been many attempts in the prior art to eliminate the problem of metastability in latching circuits. For example, U.S. Pat. No. 4,929,850 to Breuninger employs two flip-flops in series to reduce the chance of metastability. There is a timing relationship between the two flip-flops such that the propagation time of the first flip-flop input to its high output level plus the set up time of the second flip-flop must be less than the minimum propagation delay time of the clock between the clock input to the first flip-flop and the clock input to the second flip-flop. Other circuitry, such as described in U.S. Pat. No. 5,789,945 to Cline, and U.S. Pat. No. 5,081,377 to Freyman, aim to reduce length of the metastable state by using a feedback system. Other circuits, such as the circuits described in U.S. Pat. No. 5,489,865 to Colvin, Sr., U.S. Pat. No. 5,999,029 to Nguyen et al., and U.S. Pat. No. 4,999,528 to Keech, attempt to prevent the simultaneous assertion of more than one input signal using a combination of logic gates as pre-filter. The circuit described by U.S. Pat. No. 5,036,221 to Brucculeri et al., tries to eliminate meta-stable event using an edge detector as an early warning signal to disable/reenable the clock input.

It is the object of the present invention to provide a simple circuit to minimize the problem of metastability.

SUMMARY OF THE INVENTION

The above object has been met by a flip-flop having metastability reduction. The newly provided flip-flop uses two flip-flops connected in a parallel configuration with an offset or delay connected to the data input of the first flip-flop. The outputs of the two flip-flops are combined and it is expected that this will increase the probability that the output of at least one of the flip-flops will be stable. Thus, when the output of one of the flip-flops goes into a metastable state, the output of the other flip-flop will be stable. When the outputs of the flip-flops are combined, the combined output should follow the output of the stable flip-flop such that the overall output of the circuit is stable. Thus, the effect of the metastability is minimized.

BRIEF DESCRIPTION OF THE DRAWINGS

FIG. 1 is an electrical circuit diagram of the metastability cancellation circuit of the present invention.

FIG. 2 is a timing diagram showing the data input, clock input and outputs of the flip-flops used in the metastability cancellation circuit of FIG. 1.

FIG. 3 is a timing diagram showing the flip-flop outputs and circuit output of the metastability circuit of FIG. 1.

FIG. 4 is a diagram showing the relationship between a triggering edge of a clock signal and various timing windows in which a data signal could become metastable.

BEST MODE FOR CARRYING OUT THE INVENTION

With reference to FIG. 1, a flip-flop 20 with metastability reduction internally employs a pair of D flip-flops 30, 31 each having a data terminal for receiving a data signal from an input line, a clock terminal for receiving a clock signal, and an output terminal for producing an output signal. The data terminals 26, 28 of the flip-flops 30, 31 are connected together and receive a data input signal at a common node 22. An input data delay 24 is placed in the data line between the common data node 22 and the data input terminal 26 of the first flip-flop circuit 30. The input data delay can be implemented by means of a buffer circuit or equivalent means. The delay time should be less than the duration of any potential metastability window. For example, the delay time could be designed as half of the metastability window. A typical metastability window is about a few hundred picoseconds which is not dependent on the clock rate. The clock terminals 29, 27 are connected together and receive the clock input signal at a common node 23. The first flip-flop 30 produces an output (Q1) 32 and the second flip-flop 31 produces an output (Q2) 33. The flip-flop outputs (Q1) 32 and (Q2) 33 are connected to form the circuit output (Q) 35.

With reference to FIG. 2, a timing diagram is shown to illustrate the operation of the circuit of FIG. 1. With reference to FIGS. 1 and 2, the data signal (D) 41 is input to the metastability cancellation circuit 20 at terminal 22 and is directly supplied to the second flip-flop 31 at the data input terminal 28. The second flip-flop output signal (Q2) 43 is the output signal of the second flip-flop 31 at the output terminal 33. The delayed data signal (D̂) 42 is the input signal received at the data input terminal 26 of the first flip-flop circuit 30 after the data signal 22 has been delayed by input data delay buffer 24. The flip-flop output signal (Q1) 44 is the output signal from the output terminal 32 of the first flip-flop circuit 30. The clock signal 45 is the signal supplied to the clock input terminal 29 of the first flip-flop circuit 30 and to the clock input terminal 27 of the second flip-flop circuit 31. The signals are plotted with respect to time 47. The durations of the signals are merely for illustrative purposes and the actual duration of the signals can vary without affecting the scope of the invention. In the example illustrated in FIG. 2, the clock signal 45 is shown to have a period of two nanoseconds. The data signals 41, 42 are asynchronous to the clock signal 45. The outputs of the flip-flops trigger on the rising edge of the clock pulse.

First, with reference to the operation of the second flip-flop 31, it can be seen that the data signal 41 is initially in a low state. The output signal 43 of the flip-flop 31 is also in a low state. At time (t) equals 3 nanoseconds (ns), the data signal 41 rises to a high state. At the same time, the clock signal 45 is on the rising, or triggering edge. This is the event that causes a metastable signal to occur. As shown, the output signal 43 is in a metastable state 55. In the metastable state, the signal is neither low nor high for an unspecified period of time. Eventually the signal 43 may adjust and become stable by going back into a low state as is shown in the example of FIG. 2. At the next rising edge of the clock signal 45 (at 5 ns), the output signal 43 rises to a high state. At time=7.5 ns, the data signal 41 goes low. The output signal (Q2) 43 stays high until the next rising edge of the clock signal at t=9 ns. Then, the data signal 41 goes high again at about t=9.5 ns. Again, the output signal 43 rises to a high logic level at the next rising edge of the clock signal t=11 ns. Then, the data signal 41 goes low at t=13 ns. Again, this occurs at the triggering edge of the clock signal, which results in the flip-flop output signal 43 going into a metastable state 56. The output signal 43 goes back to a high state and then transitions to a low state at the next triggering edge of the clock (t=15 ns).

Next, the operation of the first flip-flop circuit 30 will be discussed. Again, the delayed data signal (D̂) 42 is low, and the first flip-flop output signal (Q1) 44 is low. Then at about t=3.5 ns, the data signal (D̂) 42 goes high. As can be seen the delayed data signal 42 has been shifted so that data transitions do not occur at the same time as the triggering edge of the clock. The output signal 44 remains in the low state 55 and then eventually goes high at the next rising edge of the clock (t=5 ns). The data signal goes low just before t=8 ns and then the output signal goes low at the next triggering edge of the clock 45 (at t=9 ns). Then, the data signal goes high just before t=10 ns and the output signal 44 follows to go to a high state at the next clock edge (t=11 ns). Finally, the data signal goes low at about t=13.25 ns and the output signal 44 follows the data signal by going to a low state when the next triggering edge clock signal occurs at t=15 ns.

With reference to FIG. 3, the output signal of the second flip-flop circuit (Q2) 43 and the output signal of the first flip-flop circuit (Q1) 44 are combined to form the circuit output (Q) 48. Again, the output signals are plotted with respect to time 47. As shown, between t=0 and t=3 ns, both of the flip-flop output circuits 43, 44 are low and therefore the circuit output signal 48 is low. At t=3 ns, the output signal (Q1) 44 is low, while the output signal (Q2) 43 is in a metastable state. When these two signals are combined, the low state of the signal (Q1) 44 is stable and negates the metastable state 55 of the (Q2) signal 43. Thus, the output signal (Q) 48 takes the form of the stable signal 44 and stays in a low state. Each of the signals remains in the low state until at t=5 ns, both signals (Q2) 43 and (Q1) 44 go high, causing the output signal (Q) 48 to also go high. At t=9 ns, both flip-flop output signals (Q2) 43 and (Q1) 44 go low, causing the circuit output 48 to go low. At t=11 ns, both of the flip-flop output signals 43, 44 go high and the circuit output signal 48 also goes high. At t=13 ns, the output signal 43 of the second flip flop goes into a metastable state 56. The output of the first flip-flop circuit 44 stays in a high state. Because the metastable signal 43 is combined with the stable signal 44, the overall circuit output 48 takes the form of the stable signal and remains in a high state. Finally, at t=15 ns, both flip-flop output signals 43, 44 go low, causing the output 48 to go low. Thus, it can be seen that by combining the two flip-flops in parallel and combining their output signals, if one of the flip-flop goes into a metastable state, the metastable state can be cancelled out by the output of the stable flip-flop in order to produce a stable output signal.

A diagram illustrating the timing employed in the metastable circuit of the present invention is shown in FIG. 4. The clock signal 83 is shown to have a triggering edge 93 as the clock transitions from a low state to a high state. The data signal 81 is shown to transition from one state (Data 0) to the other logic state (Data 1). In this transition, there is a window 91 in which the signal could cause the output signal to become metastable. The duration of this window is illustrated by the period T 95 which is centered on the triggering edge 93 of the clock signal 91. The delayed data signal 82 is shown to be similar to the data signal 81, except that it is delayed by a small period of time 96. The potential metastable window 92 of the delayed data signal 82 is thus also shifted such that only a portion of the period T' 97 of metastable window 92 is within the period T 95 of the metastable window of the data signal 81. When the two data signals, 81 and 82, are combined, this results in an output signal 84 having a smaller metastable window 94 than either of the metastable windows 91, 92 of either of the data signals 81, 82. Thus, the metastability cancellation circuit of the present invention reduces the metastability window, resulting in a more stable output signal.

What is claimed is:

1. A flip-flop circuit with metastability reduction comprising:
    a first and a second flip-flop circuit connected together in a parallel configuration relative to an input line, each flip-flop circuit having a data input terminal associated with the input line, a clock input terminal, and an output terminal;
    a input data delay connected to the data input terminal of the first flip-flop circuit; and
    wherein the output terminal of the first flip-flop circuit is connected to the output terminal of the second flip-flop circuit to form a single circuit output.

2. The flip-flop circuit of claim 1 wherein the input data delay is a delay buffer.

3. The flip-flop circuit of claim 1 wherein each of the first and second flip-flop circuits produce a flip-flop output signal on their respective output terminal, and wherein at least one of the flip-flop output signals is in a stable state.

4. The flip-flop circuit of claim 3 wherein one of the flip-flop output signals is in a metastable state and the other of the flip-flop output signals is in the stable state.

5. The flip-flop circuit of claim 4 wherein the flip-flop output signal in the stable state cancels the flip-flop output signal in the metastable state to produce a stable output signal at the circuit output.

6. A flip-flop circuit with metastability reduction comprising:
    a first and a second flip-flop circuit, each flip-flop circuit having a data input terminal, a clock input terminal, and an output terminal, the data input terminal of the first flip-flop circuit being connected to the data input terminal of the second flip-flop circuit, the clock terminal of the first flip-flop circuit being connected to the clock terminal of the second flip-flop circuit, and the output terminal of the first flip-flop circuit being connected to the output terminal of the second flip-flop circuit to form a single circuit output;
    a input data delay connected to the data input terminal of the first flip-flop circuit; and
    wherein each of the first and second flip-flop circuits produce a flip-flop output signal on their respective output terminal, and wherein at least one of the flip-flop output signals is in a stable state.

7. The flip-flop circuit of claim 6 wherein one of the flip-flop output signals is in a metastable state and the other of the flip-flop output signals is in the stable state, the flip-flop output signal in the stable state cancelling the flip-flop output signal in the metastable state to produce a stable output signal at the circuit output.

8. The flip-flop circuit of claim 6 wherein the input data delay is a delay buffer.

* * * * *